United States Patent [19]
Saito

[11] Patent Number: 5,561,072
[45] Date of Patent: Oct. 1, 1996

[54] METHOD FOR PRODUCING SHALLOW JUNCTION IN SURFACE REGION OF SEMICONDUCTOR SUBSTRATE USING IMPLANTATION OF PLASMA IONS

[75] Inventor: Shuichi Saito, Tokyo, Japan

[73] Assignee: NEC Corporation, Japan

[21] Appl. No.: 342,604

[22] Filed: Nov. 21, 1994

[30] Foreign Application Priority Data

Nov. 22, 1993 [JP] Japan .................................. 5-315935

[51] Int. Cl.$^6$ ................................................ H01L 21/265
[52] U.S. Cl. ............................ 437/24; 437/165; 437/933; 437/950
[58] Field of Search .............................. 437/16, 24, 165, 437/166, 933, 950; 148/DIG. 144

[56] References Cited

U.S. PATENT DOCUMENTS

| | | | |
|---|---|---|---|
| 4,835,112 | 5/1989 | Pfiester et al. | 437/24 |
| 5,145,794 | 9/1992 | Kase et al. | 437/24 |
| 5,270,250 | 12/1993 | Murai et al. | 437/165 |
| 5,403,756 | 4/1995 | Yoshinouchi et al. | 437/933 |

FOREIGN PATENT DOCUMENTS 1-120015  5/1989  Japan .

OTHER PUBLICATIONS

Wolf, "Silicon Processing for the VLSI Era, vol. 2", 1986, pp. 264–265.

*Primary Examiner*—Chandra Chaudhari

[57] ABSTRACT

In a method for forming a shallow junction in a surface region of a semiconductor substrate of a first conductive type, first plasma ions of one of Si and Ge is implanted into the surface region of the semiconductor substrate in a vacuum, second plasma ions of one of impurities of a second conductive type is implanted into the surface region of the semiconductor substrate in a vacuum, and, after performing the above-described two implantation steps, the semiconductor substrate is heat treated in a specific condition selected from the same vacuum condition and an inert gas condition. The substrate can be heat-treated in the specific condition within 20 hours after the substrate is brought into the air from the vacuum where the implantation steps have been performed. The first plasma ion implantation is performed prior to the second plasma ion implantation. However, both of them can be performed simultaneously.

9 Claims, 5 Drawing Sheets

METHOD FOR PRODUCING SHALLOW JUNCTION IN SURFACE REGION OF SEMICONDUCTOR SUBSTRATE USING IMPLANTATION OF PLASMA IONS

BACKGROUND OF THE INVENTION

The present invention relates to production of semiconductor devices and, in particular, to formation of a shallow junction due to shallow doping of impurity into a surface layer of a semiconductor substrate.

As semiconductor devices have recently been densified and small-sized, it has been demanded in MOS transistors that a diffused junction is formed at a shallow depth from a surface of source or drain region in the substrate. For example, the depth of the diffused junction is actually known about 0.1 µm in 64M (Megabits) DRAM (Dynamic Random Access Memory) and 0.08 µm in 256M DRAM. It is estimated to be 0.06 µm in 1G (Gigabit) DRAM.

In order to form such a shallow junction, there are two problems to be resolved, one of which is shallow doping of impurity, and the other being a low heat load for a heat-treatment or an annealing of the substrate doped with the impurity. The latter, that is, the low heat load is necessary for the doped impurity to be prevented from diffusing into the substrate during the heat treatment. This is realized by performing the heat treatment at a low temperature or performing the heat treatment for a short time at a high temperature such as a method of, so called, lamp annealing. Techniques to resolve the latter problem have been studied and effective ones have been developed.

However, the former problem is still remained as an important problem.

The ion implantation is mainly used for doping impurity into the semiconductor substrate. In order to form the shallow junction by use of the ion implantation, ion implantation must be performed at a low voltage such as several kilovolts. This is important for ions of boron which is used as p-type impurity because the lighter mass boron penetrates a deeper region. However, it is difficult in use of the low voltage to maintain a high electric current stable.

A plasma doping method has been proposed for implanting impurity ions into the substrate at a low voltage. According to the method, $B_2H_6$ or $PH_3$ gas is mixed with $H_2$ or He gas to form a mixed gas, and a DC voltage of about 900 V is applied between electrodes in the mixed gas to form a plasma so that ions of B or P are formed and accelerated by the electric field and are implanted into the substrate disposed in the mixed gas. Although the impurity doped region can be limited to a shallow region of the substrate, a problem is that activation of the doped impurity is not sufficient.

In order to resolve the problem, Japanese patent application laid open with a number of JP-A-1 120015 proposed another ion implantation method where the impurity gas was diluted by Ar gas of a high purity. In detail, the impurity gas such as $B_2H_6$ gas is introduced together with Ar gas in a plasma doping apparatus under regulation of its flow rate, and the plasma is generated by application of DC voltage such as about 1,000 volts or less to perform doping B ions. As a result, a boron doped region is formed with a carrier concentration of $1 \times 10^{21}$ cm$^{-3}$ which is excessive of solid solubility.

According to the description of JP-A-1 120015, the low activation of the impurity doped by the plasma doping method is caused by a fact of use of hydride or fluoride of the impurity because the impurity is connected with hydrogen or fluorine to form connections such as B—H, P—H, Ac—H or B—F in the doped region. In order to prevent connection of the impurity with hydrogen or fluorine, Ar gas is used together with the hydride or fluoride gas of the impurity so that Ar ions are doped into the substrate together with the impurity ions. Thus, high activation of the doped impurity is insured.

In the method proposed in JP-A-1 120015, a large amount of Ar ions are doped into the substrate and therefore, generate voids in the Ar doped region by the heat treatment after doping. Since boron ions and phosphorus ions are doped deeper than Ar ions, the diffused junction is not damaged by the doped Ar ions and free from degradation of property. However, impurity ions such as As ions are doped shallower than Ar ions and the diffused junction is therefore degraded by the Ar ion doping.

SUMMARY OF THE INVENTION

It is an object of the present invention to provide a method for forming a shallow junction which is excellent in properties and stable in carrier concentration.

According to the present invention, a method for forming a shallow junction in a surface region of a semiconductor substrate of a first conductive type is obtained. The method comprises steps of: performing implantation of plasma ions of one of Si and Ge into the surface region of the semiconductor substrate in a vacuum; performing implantation of plasma ions of one of impurities of a second conductive type into the surface region of the semiconductor substrate in a vacuum; heat treating, after performing the above-described two implantation steps, the semiconductor substrate in a specific condition selected from the same vacuum condition and an inert gas condition.

In the method, the substrate can be heat-treated in the specific condition within 20 hours after the substrate is brought into the air from the vacuum where the implantation steps have been performed.

The implantation of plasma ions of one of Si and Ge is performed by introducing a gas of $SiH_4$, $SiF_4$, $GeH_4$, or $GeF_4$ into the vacuum, generating a plasma in an electric field of several kilovolts to form ions of Si or Ge, and accelerating the Si or Ge ions to implant the ions into the surface region of the semiconductor substrate.

The implantation of plasma ions of the impurity of a second conductive type is performed by introducing a gas of $B_2H_6$, $BF_3$, $PH_3$, $Pf_5$, $AsH_3$ or the like into the vacuum, generating a plasma in an electric field of several kilovolts to form the impurity ions of P, B, As, or the like, and accelerating the impurity ions to implant the impurity ions into the surface region of the semiconductor substrate.

The implantation of plasma ions of one of Si and Ge is firstly performed, thereafter, the implantation of plasma ions of the impurity is performed.

The implantation of plasma ions of one of Si and Ge and the implantation of plasma ions of the impurity can be simultaneously performed.

Further, the present invention provides an apparatus for forming a shallow junction in a surface region of a semiconductor substrate, which comprises: a vacuum chamber; flat electrodes disposed in parallel with each other within the chamber; heating means for heating material loaded on the flat electrodes; electric power source for applying high frequency electric voltage across the flat electrodes to generate a plasma; gas feeding means for feeding gas to be introduced and inert gas into the vacuum chamber; and the vacuum chamber having an inner surface coated with a thin film of Si or SiO$_2$ on at least one region thereof to be exposed to the plasma.

DESCRIPTION OF THE INVENTION

It is considered that the low activation of the impurity doped by the plasma doping method is caused by the following two problems. The first one is crystallinity in the substrate doped with the impurity. The crystallinity in the silicon substrate just after doping of the impurity was measured by the back-scattering method of the thermal wave method. It was confirmed from the measurement that the crystals were not almost destroyed although the peak concentration of the impurity was about $1 \times 10^{21}$ cm$^{-3}$. Accordingly, it is considered that the doped impurity cannot be activated so that the low carrier concentration is resulted.

The other one is oxidation of the impurity, in the substrate doped with the impurity by the plasma doping method, the doped impurity concentration is maximum at the surface of the substrate and decreases with distance from the surface in the depth. It was confirmed by the XPS (X ray Photoelectron Spectroscopy) measurement that the doped impurity at the surface was exposed in the atmosphere and reacted with water contents in the air to form the oxide of the impurity. Accordingly, the oxide of the impurity cannot effectively diffuse into the substrate even by the heat treatment, so that the impurity is not activated.

The above-described examination teaches us that improvement of carrier concentration can be realized by destroying the crystallinity in the impurity doped region to make the region amorphous or non-crystalline and by heat-treating the substrate doped with the impurity without exposure in the air and with oxidation of the impurity.

According to the present invention, Si and/or Ge is used for non-crystallization of the impurity doped region and is implanted in the substrate. The implanted Si and/or Ge do not badly affect the impurity semiconductor device. The implantation of Si and/or Ge can be carried out before or after impurity implantation or simultaneously therewith, because it is sufficient the non-crystallization is realized before the heat treatment.

In order to prevent the impurity from oxidation, it is considered that the heat treatment is carried out just after performing the ion implantation and in the vacuum condition where the ion implantation has been carried out. Alternatively, the substrate doped with the impurity is brought into an inert gas such as nitrogen or argon and is kept in the gas. Thereafter, it can be heat treated in the inert gas.

Taking into consideration the above described two requirements for improving the carrier concentration, the present invention is made to provide semiconductor device with an improved activation of doped impurity.

Now, description will be made as to embodiments of the present invention with reference to the drawings annexed hereto.

DESCRIPTION OF EMBODIMENTS

Figure 1:
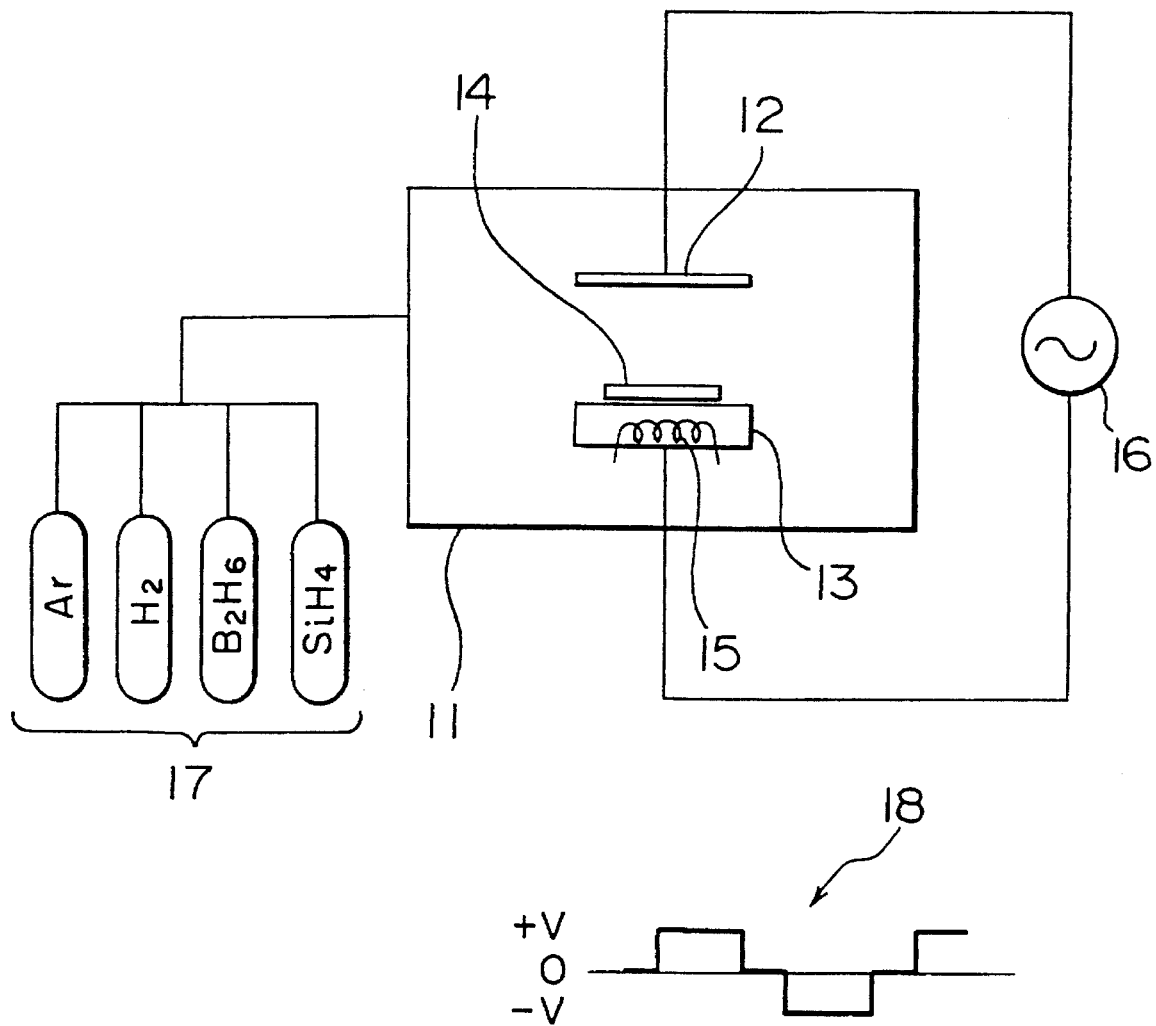
FIG. 1 schematically shows a structure of a doping apparatus used in performing the method of the present invention.

Referring to FIG. 1, the doping apparatus shown therein comprises a vacuum chamber 11, and a parallel flat type electrode structure of an upper electrode 12 and a lower electrode 13 disposed in the chamber 11. A semiconductor substrate 14 of a sample is disposed onto the lower electrode 13. The lower electrode 13 is provided with an electric heater 15 for heating the semiconductor substrate 14 during and after the impurity doping process. A high frequency AC voltage is applied across the upper and lower electrodes 12 and 13 from a high frequency electric power source 16. SiM$_4$ and B$_2$H$_6$ gas sources are used for impurity sources, and Ar and H$_2$ gas sources are also used for carrier gas sources. Those gas sources are collectively shown at 17 and are connected to the chamber 11 for selectively supplying those gases into the chamber 11. An inner metallic wall of the chamber 11 is coated with Si and SiO$_2$ film for preventing the inner metallic wall from being exposed in plasma generated in the chamber 11.

In order to generate the plasma for formation of the shallow junction by use of the doping device, an AC voltage is applied across the upper and the lower electrodes 12 and 13 from the high frequency AC power source 16 as indicated by a waveform having positive and negative voltages +V and −V which are alternated shown at 18 in FIG. 1. The voltage V is about 0.5–4 kilovolts.

Now, referring to FIGS. 2A to 2D, description will be made as to formation of a shallow junction by use of the doping device shown in FIG. 1.

Figure 2A:
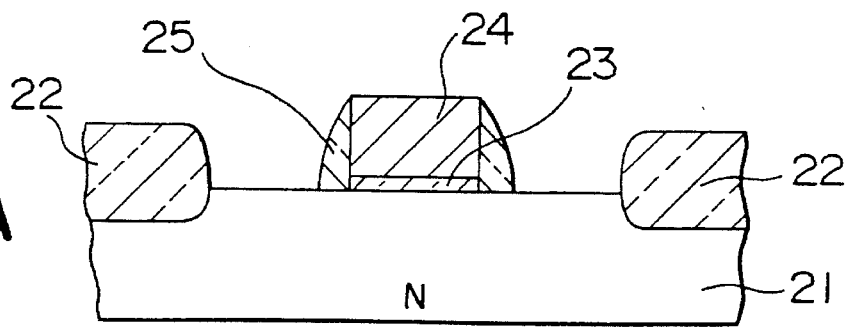
FIGS. 2A to 2D illustrate cross sectional views of a semiconductor substrate at different steps for forming the shallow junction according to the present invention.
Figure 2B:
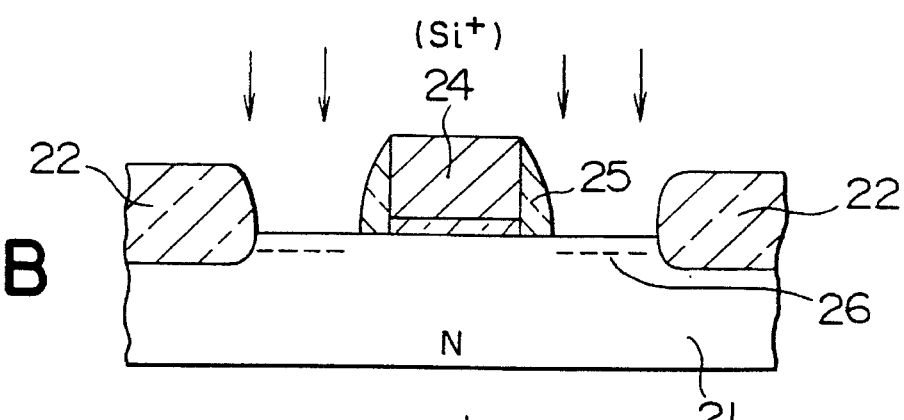
Figure 2C:
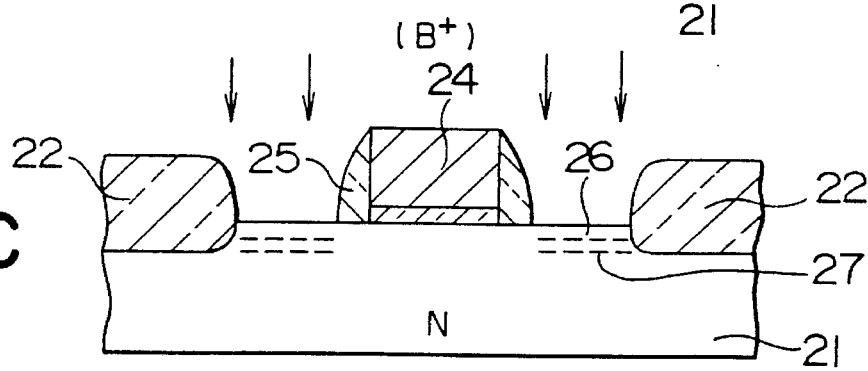

As shown in FIG. 2A, a silicon substrate 21 of n-type was prepared and oxide films 22 were formed on the substrate 21 so as to isolate adjacent semiconductor elements formed in the substrate 21. Then, a gate oxide film 23 was formed with a thickness of 10 nm on a surface region between the isolation oxide films 22. A pair of surface regions were left between the gate oxide film 23 and opposite isolation oxide films 22. A polysilicon film layer was formed to overlie the isolation oxide films 22, the gate oxide film 23 and the pair of surface regions on the substrate 11 and was partially removed by the dry etching technique to leave a remaining portion of the polysilicon as a gate electrode 24 on the gate oxide film 23. Thereafter, side walls 25 were formed on opposite sides of the gate electrode 24 by formation of another oxide layer on the substrate followed by the etching back. Thereafter, the impurity was doped in the surface regions of the substrate 21 by use of the doping device of FIG. 1 to form a source and a drain region in the surface regions.

Natural oxide layers on the surface regions of the substrate 21 were removed by use of HF-base etching agent. Then, the sample was loaded in the doping apparatus of FIG. 1. SiH$_4$ gas having a concentration of 5000 ppm was introduced together with H$_2$ carrier gas of the remainder part into the chamber at a flow rate of 20 ccm while the high frequency voltage was applied across the upper and lower electrodes with voltage variation between 1 and 3 kilovolts to perform the Si ion implantation into the surface regions, as shown by arrows in FIG. 2B. The resultant Si ion doped regions are shown at 26 in the figure.

Thereafter, in place of $SiH_4$ gas, the $B_2H_6$ gas with a concentration of 5,000 ppm was introduced together with $H_2$ carrier gas of the remainder part into the chamber. The high frequency AC voltages of 0.5–4 kilovolts, for example, 1.2 kilovolts was applied to the upper and the lower electrodes to generate a plasma. The vacuum chamber was maintained at a vacuum of 24–26 mTorr and the plasma was maintained for four minutes to perform B ion implantation, as shown by arrows in FIG. 2C. The B ion doped layer is shown at 27 in the figure.

Figure 2D:
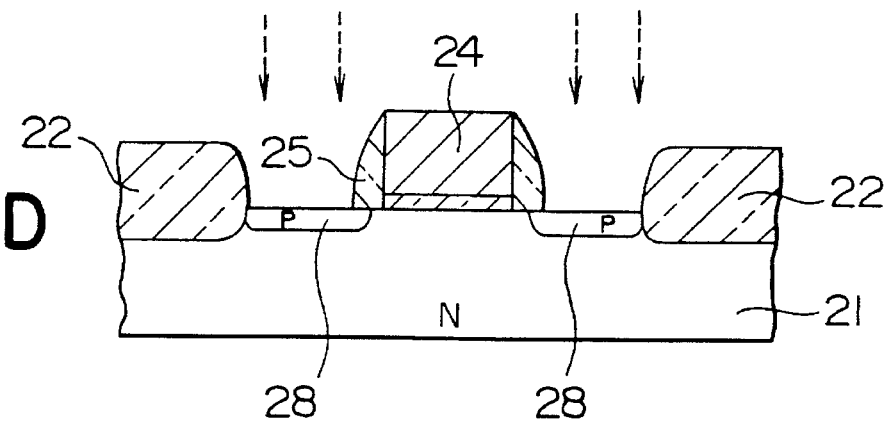

Then, by irradiation of lamp light as shown by dotted arrows in FIG. 2D, the sample substrate was heat-treated in the chamber with the vacuum condition same as the B ion doping was carried out. The heat-treatment was performed at a temperature of 1,050° C. for 10 seconds. As a result, the source and the drain regions 28 of p type were formed. Thus, an MOS transistor was formed in the substrate 11.

With the MOS transistor, the boron distribution in the source and the drain regions after heat treatment was evaluation by use of the SIMS and the SR methods.

Figure 3:
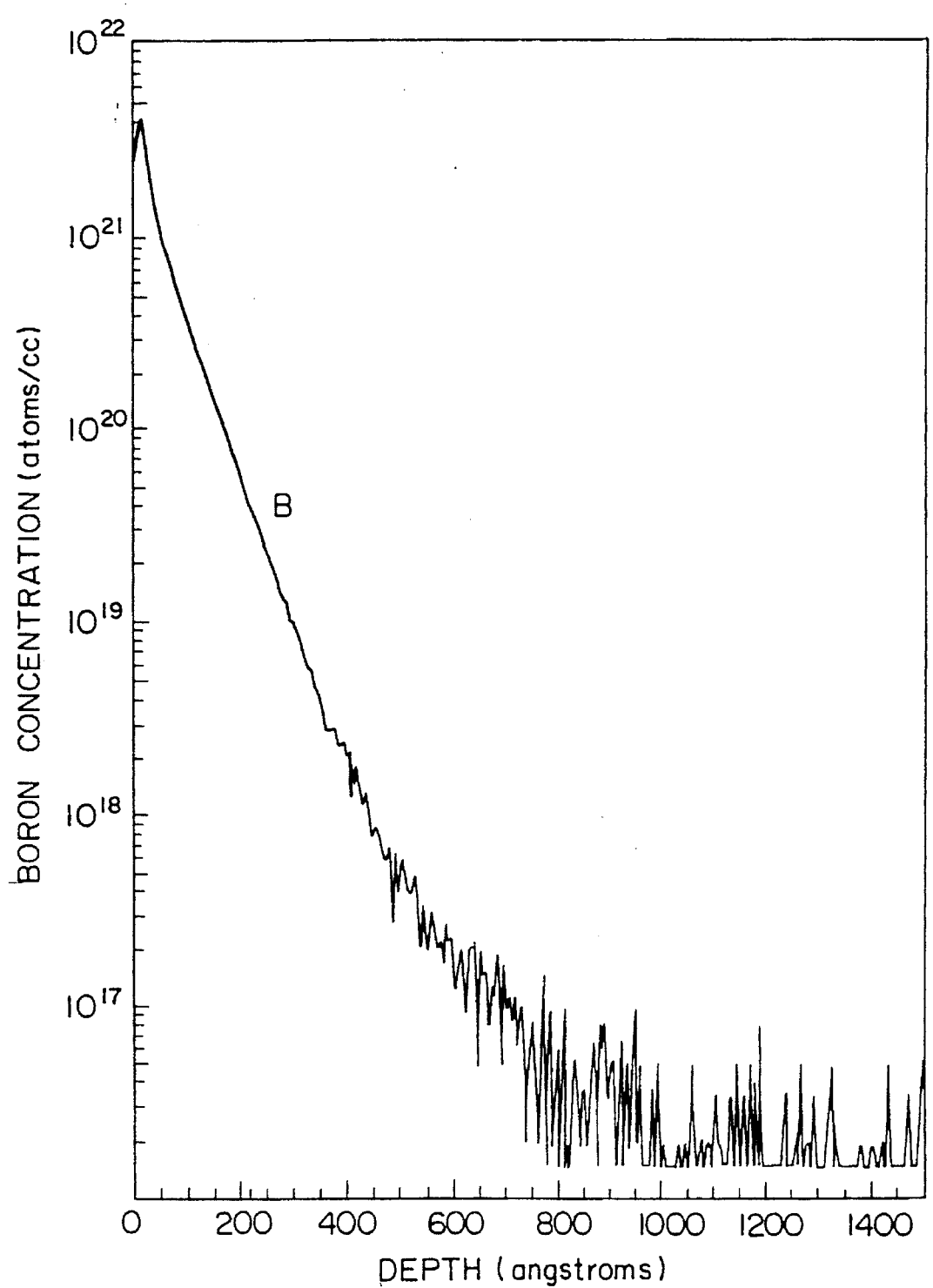
FIG. 3 shows a concentration distribution of boron doped into the substrate according to the present invention which was measured by the SIMS (Secondary Ion Mass Spectroscopy) method.

FIG. 3 shows the measured result by the SIMS method. It is seen from FIG. 3 that B was doped over the depth of 60 nm from the surface of the substrate.

Figure 4:
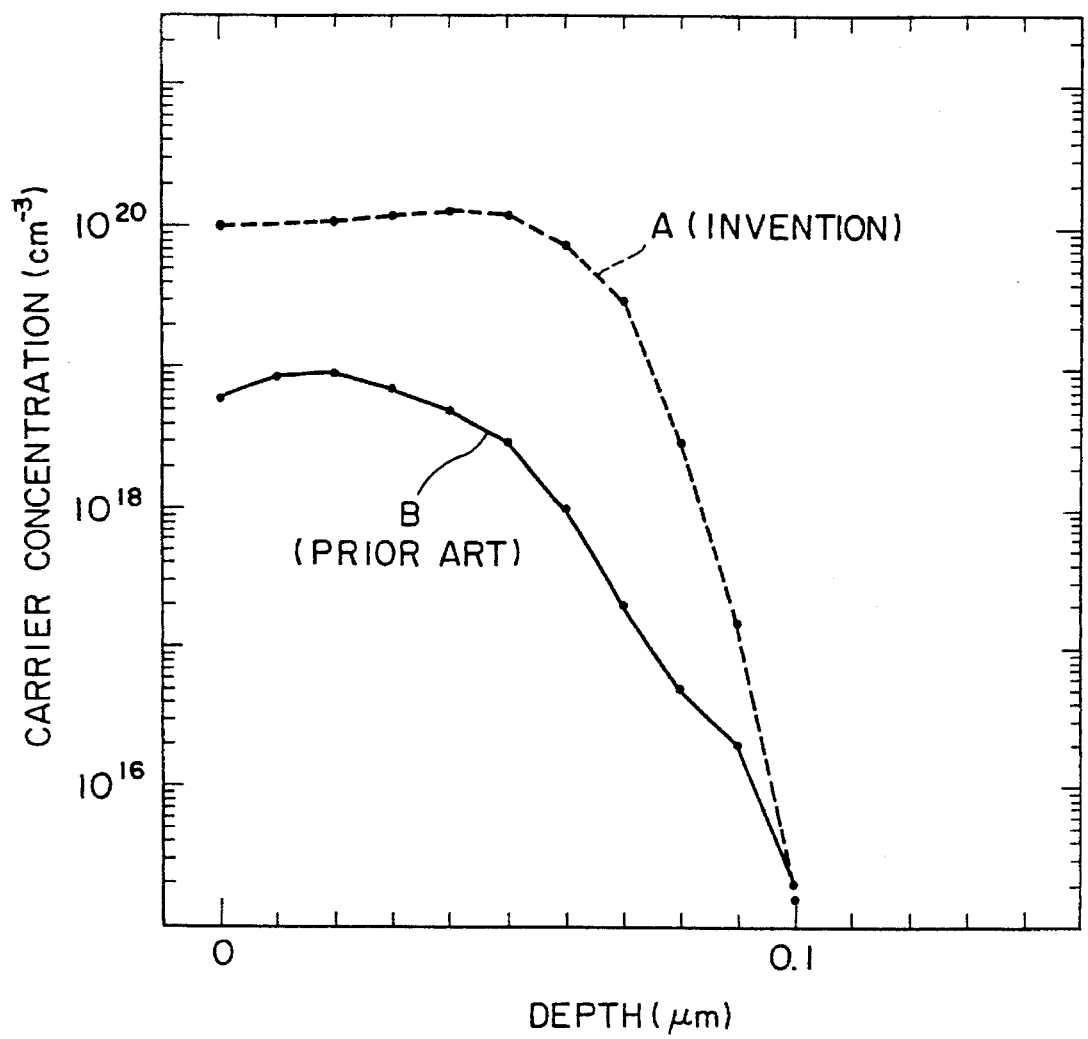
FIG. 4 shows a carrier concentration distribution in the substrate doped with the impurity and heat treated according to the present invention which was measured by the SR (spreading resistance) method.

FIG. 4 shows the carrier concentration after heat treatment which was measured by use of the SR method. In the figure, a dotted curve line A demonstrates carrier concentration in the transistor obtained by use of the present invention. The other solid curve line B shows that according to the prior art where the heat treatment was carried out in the air after boron doping without Si doping. It is understood from both of them that the peak carrier concentration of about $1 \times 10^{20}$ $cm^{-3}$ can be realized by the present invention, in comparison with the peak concentration of $1 \times 10^{19}$ $cm^{-3}$ in the prior art.

In the embodiment described above, B doping was carried out after Si doping. However, B doping and Si doping can simultaneously be carried out by controlling flow rates of B and Si source gases into the vacuum chamber.

In the described embodiment, the heat treatment was carried out after impurity doping and in the same vacuum condition where the impurity doping was carried out. However, the heat treatment can be carried out at any time after the Si and B doped sample is brought into a nitrogen or argon gas from the doping device. Alternatively, it was confirmed that the heat treatment could also effectively be carried out in an inert gas condition of in a vacuum condition with 20 hours after the Si and B doped sample was brought into the atmosphere from the doping device.

Figure 5:
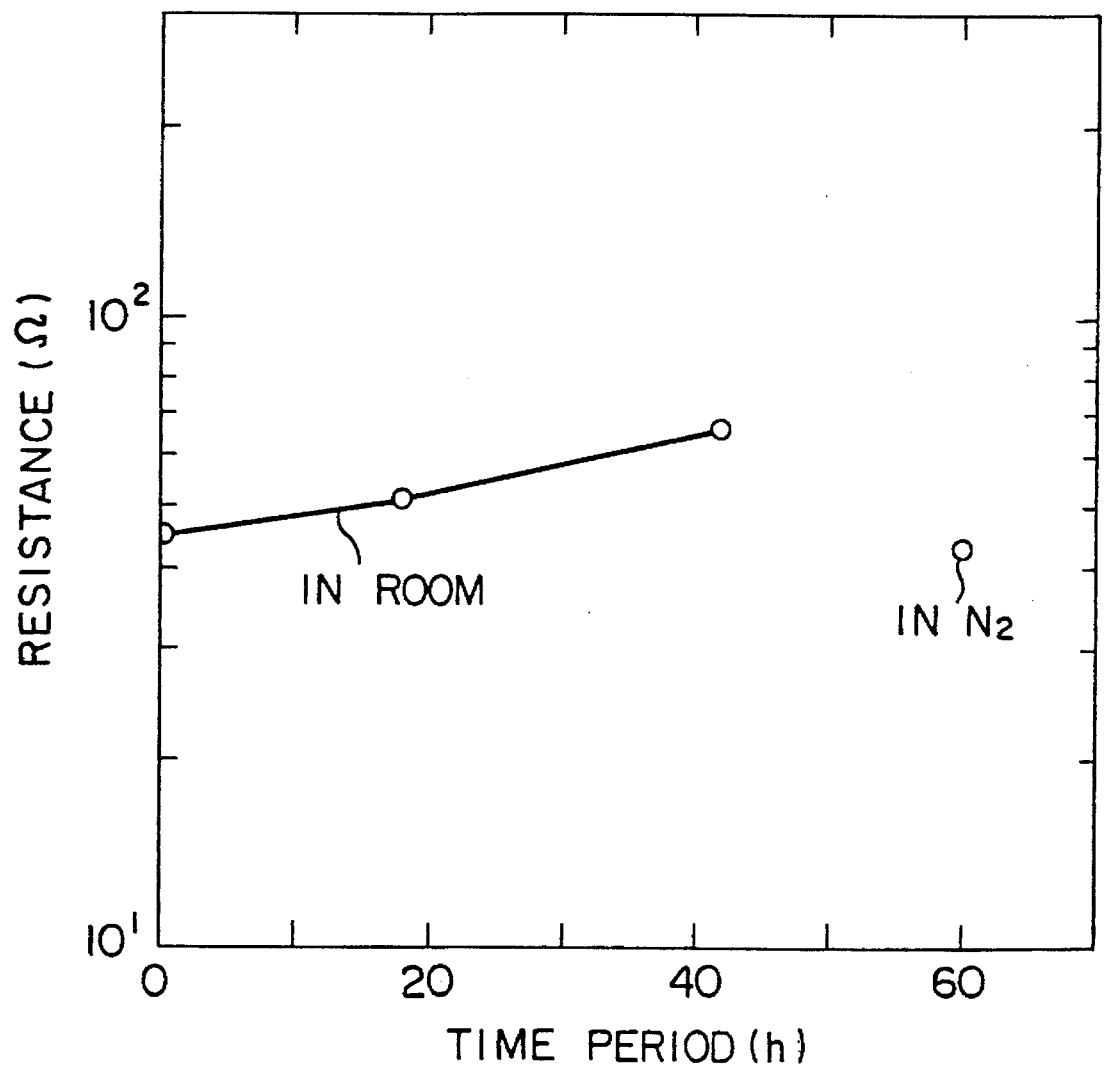
FIG. 5 shows variation of resistance value of a boron diffusion region formed by the present invention in response to a time period left in the air.

FIG. 5 shows resistance of the diffused layer in response to the time period when the doped sample is left in the room and that of another sample left in $N_2$ gas for 60 hours. It is understood from FIG. 5 that the resistance increases as the time period in the atmosphere is extended but the increase is about 10% and is maintained within the allowance if the time period in the atmosphere does not exceed 20 hours. Accordingly, when the doped sample is kept in the atmosphere, it must be subjected to the heat treatment in the inert gas or in the vacuum before elapse of 20 hours. In comparison with this, the resistance was maintained constant without increase even after elapse of 60 hours in $N_2$ gas.

When the shallow junction is formed by the method according to the present invention, the semiconductor substrate surface can be maintained flat without being roughed, the doped impurity is sufficiently activated, and the peak carrier concentration about $1 \times 10^{20}$ $cm^{-3}$ is realized. The diffused junction can be formed at a depth of 0.08–0.1 µm from the substrate surface. This means that the present invention can be applied to production of semiconductor devices which have the minimum line width of 0.4 µm or less as a device rule and devices of ULSI (Ultra Large Scale Integration).

It should be noted in the present invention that $SiF_4$ gas can also be used for a Si source gas. Further, Ge can be doped in place of Si, and $GeH_4$ and $GeF_4$ gases can be therefore used for Ge source gases. Further, $BF_3$, $PH_3$, $PF_5$, and $AsH_3$ gases can be also used for impurity source gases as well as $B_2H_6$ gas.

What is claimed is:

1. A method for forming a shallow junction in a surface region of a semiconductor substrate of a first conductive type, comprising steps of:

performing implantation of plasma ions of one of Si or Ge into the surface region of said semiconductor substrate in a vacuum:

performing implantation of plasma ions of one of impurities of a second conductive type into the surface region of said semiconductor substrate in a vacuum;

heat treating, after performing the above-described two implantation steps, said semiconductor substrate in one condition selected from a vacuum condition and an inert gas condition.

2. A method as claimed in claim 1, wherein said substrate is heat-treated in said particular condition within 20 hours after said substrate is brought into the atmosphere from the vacuum where said implantation steps have been performed.

3. A method as claimed in claim 1, wherein said implantation of plasma ions of one of Si or Ge is performed by introducing a gas of $SiH_4$, $SiF_4$, $GeH_4$, or $GeF_4$ into the vacuum, generating a plasma in an electric field to form ions of Si or Ge, and accelerating said Si or Ge ions to implant said ions into the surface region of said semiconductor substrate.

4. A method as claimed in claim 1, wherein said implantation of plasma ions of the impurity of a second conductive type is performed by introducing a gas of $B_2H_6$, $BF_3$, $PH_3$, $PF_5$, or $AsH_3$ into the vacuum, generating a plasma in an electric field to form the impurity ions of P, B, or As, and accelerating said impurity ions to implant said impurity ions into the surface region of said semiconductor substrate.

5. A method as claimed in claim 1, wherein said implantation of plasma ions of one of Si or Ge is firstly performed, thereafter, said implantation of plasma ions of the impurity is performed.

6. A method as claimed in claim 1, wherein said implantation or plasma ions of one of Si or Ge and said implantation of plasma ions of the impurity are simultaneously performed.

7. A method as claimed in claim 4, wherein said electric field is approximately from 0.5 to 4 kilovolts.

8. A method as claimed in claim 3, wherein said electric field is approximately from 0.5 to 4 kilovolts.

9. A method as claimed in claim 1, wherein after said two implantation steps, said substrate is maintained in a vacuum or an inert gas until it is subjected to said heat treating step.

* * * * *